United States Patent [19]

Barbier et al.

[11] 4,215,278

[45] Jul. 29, 1980

[54] DETECTOR FOR ABNORMAL PHENOMENA

[75] Inventors: Daniel Barbier, Echirolles; Jean C. Lancre, Antony; Bernard Lauwick, Montrouge; Robert Poujois, Grenoble, all of France

[73] Assignees: Commissariat a l'Energie Atomique, Paris; Compagnie Centrale SICLI, Le Blanc Mesnil, both of France

[21] Appl. No.: 924,109

[22] Filed: Jul. 12, 1978

Related U.S. Application Data

[63] Continuation of Ser. No. 689,617, May 24, 1976, abandoned.

[30] Foreign Application Priority Data

Jun. 2, 1975 [FR] France ............................... 75 17163

[51] Int. Cl.[2] ...................... H01H 35/00; H01L 31/00

[52] U.S. Cl. .................................... 307/116; 307/359; 340/664

[58] Field of Search .............. 307/116, 117, 118, 152, 307/352, 353, 359; 328/2, 3, 5; 340/177 CA, 146.1 BA, 661, 664, 589; 324/98 R, 99 R

[56] References Cited

U.S. PATENT DOCUMENTS

| | | | |
|---|---|---|---|
| 3,455,148 | 7/1969 | Foster et al. | 340/177 CA |
| 3,725,748 | 4/1973 | Atkins | 361/181 |
| 3,927,336 | 12/1975 | Carlson et al. | 307/116 X |

*Primary Examiner*—L. T. Hix
*Assistant Examiner*—James L. Dwyer
*Attorney, Agent, or Firm*—Sughrue, Rothwell, Mion, Zinn & Macpeak

[57] ABSTRACT

The detector comprises a transducer designed to convert to an electrical signal a physical quantity which is representative of an abnormal phenomenon. The output of the transducer is connected to one input of a comparator whose output is connected to a delay circuit. The output of the delay circuit controls a signal generator, the output of which is connected to the other input of the comparator, the signal delivered by the comparator being representative of the time-dependent variations of the signal delivered by the transducer.

17 Claims, 12 Drawing Figures

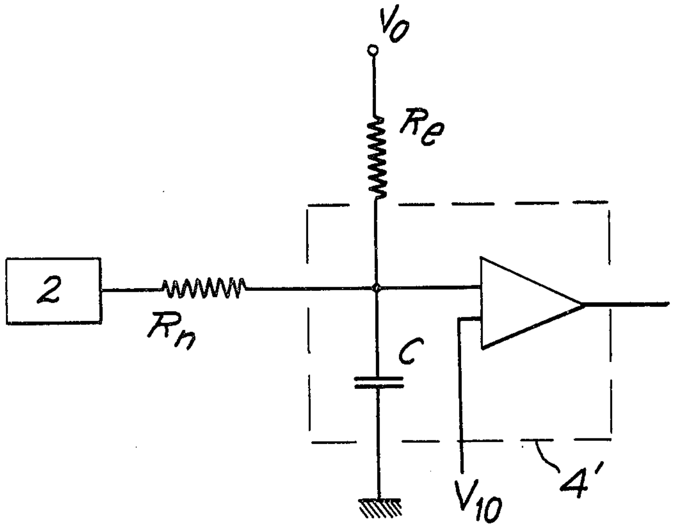
FIG. 4'
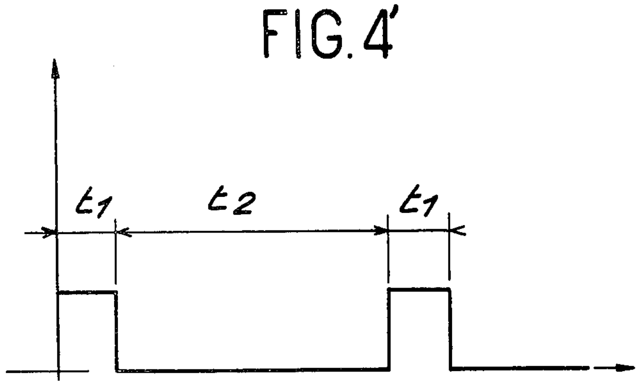
FIG. 5'
FIG. 10
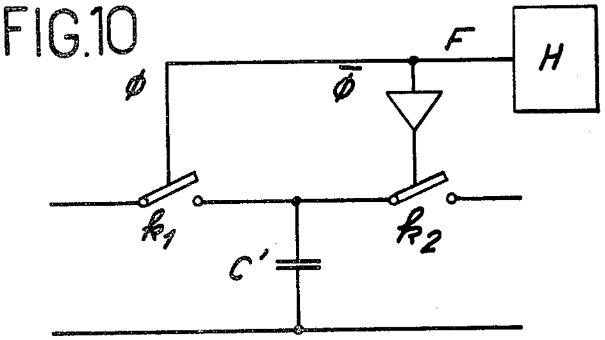

DETECTOR FOR ABNORMAL PHENOMENA

This is a continuation of application Ser. No. 689,617, filed May 24, 1976, abandoned.

This invention relates to a detector for abnormal phenomena.

In more precise terms, the present invention is concerned with a device for delivering a signal and if necessary for triggering an alarm when a physical quantity which is characteristic of a certain phenomenon exhibits variations corresponding to abnormal conditions. The abnormal phenomenon in question can be a fire or an attempt to break into premises, for example.

In the first case, the physical quantity could be a temperature, a smoke density, an infrared radiation and so forth. In the second case, it could consist, for example, of the light intensity measured by a photoelectric cell or an abnormal pressure on a glass panel or on any other object as a result of an attempt at forcible entry.

It is known that devices of this type usually comprise a transducer for converting the intensity of the physical quantity to an electrical signal (current or voltage) as well as an assembly for processing said electrical signal in order to determine whether the phenomenon is really abnormal and, if this does in fact prove to be the case, in order to trigger the alarm or to start-up a safety system of any suitable type.

Many detectors for abnormal phenomena or alarm detectors and especially fire detectors are of course already in existence. In these detectors, the electrical quantity delivered by the transducer is usually compared with a fixed reference quantity.

This method of treatment which is applied directly to the quantity itself has a disadvantage in that it gives rise to many untimely actuations of the alarm since a device of this type does not take into account the mode of variation of the physical quantity.

Finally, transducers usually deliver very low currents which cannot readily be processed by means of the known methods.

The precise aim of the present invention is to provide a detector for abnormal phenomena which overcomes the disadvantages mentioned in the foregoing.

The detector for abnormal phenomena essentially comprises a transducer designed to convert to an electrical signal a physical quantity which is representative of an abnormal pheomenon, the output of said transducer being connected to one of the inputs of a comparator whose output is connected to a delay circuit, the output of said delay circuit being intended to control a signal generator whose output is connected to the other input of said comparator, the signal delivered by said comparator being representative of the time-dependent variations of the signal delivered by said transducer. The detector is preferably provided in addition with a circuit for comparing the signal delivered by said comparator with a preset level.

Preferably, the signal delivered by said transducer is an electric current.

Preferably, the signal generator is a current generator of the charge-transfer type, and a voltage-frequency converter is interposed between said delay circuit and said generator.

In a preferred embodiment, the comparator is constituted by a capacitor in which one of the plates receives the current delivered by said transducer and the current delivered by said generator and in which the other plate is connected to ground.

A more complete understanding of the invention will in any case be obtained from the following description of a number of embodiments which are given by way of example and not in any limiting sense, reference being made to the accompanying drawings, wherein.

Figure 4:
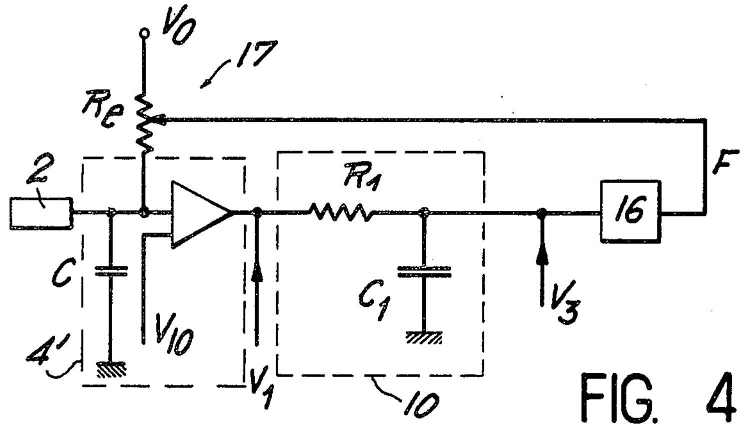
FIG. 4 is more elaborate form of construction of the detector.
Figure 5:
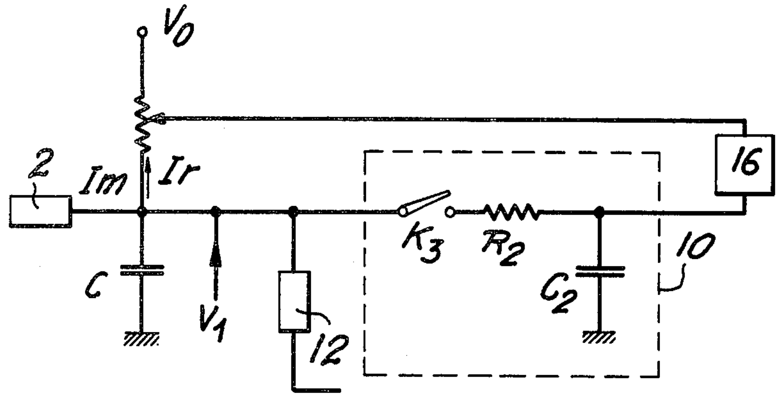
Figure 7:
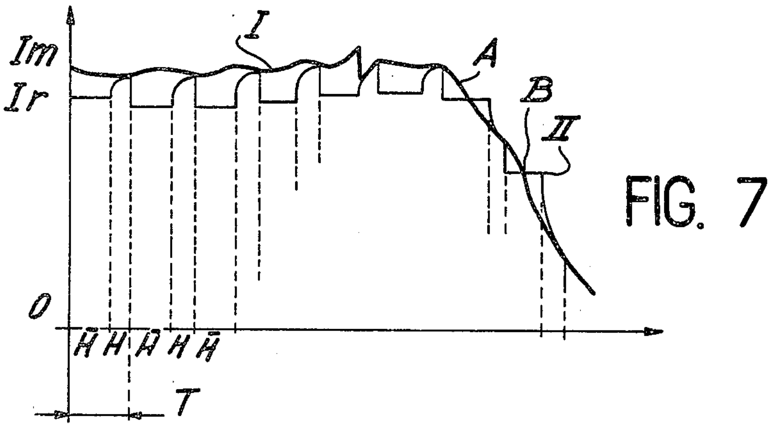
Figure 6:
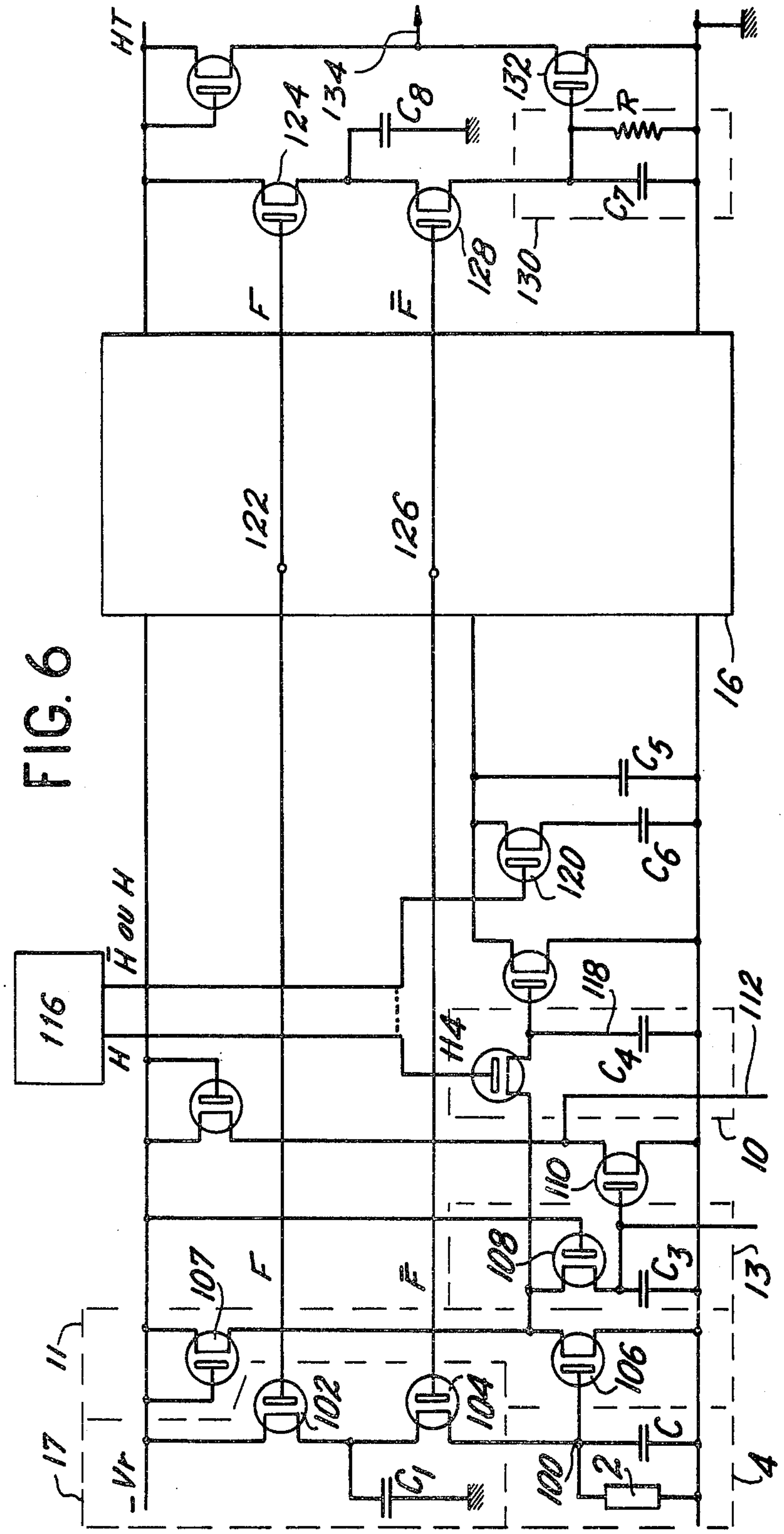
Figure 9:
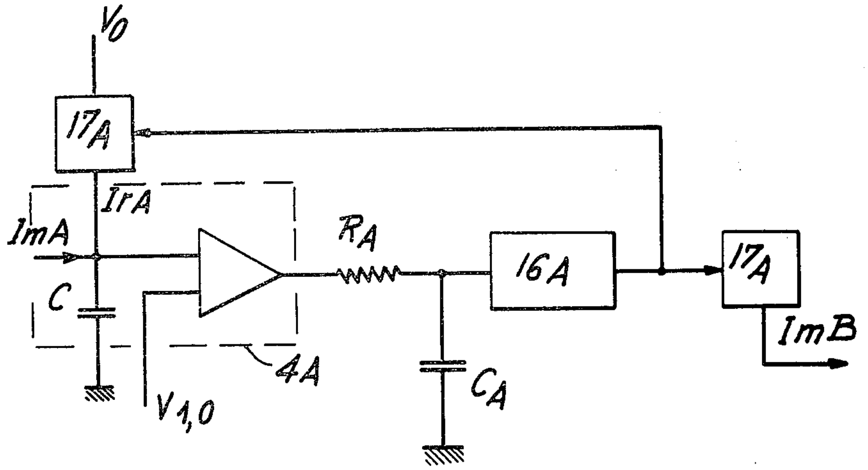
Figure 8:
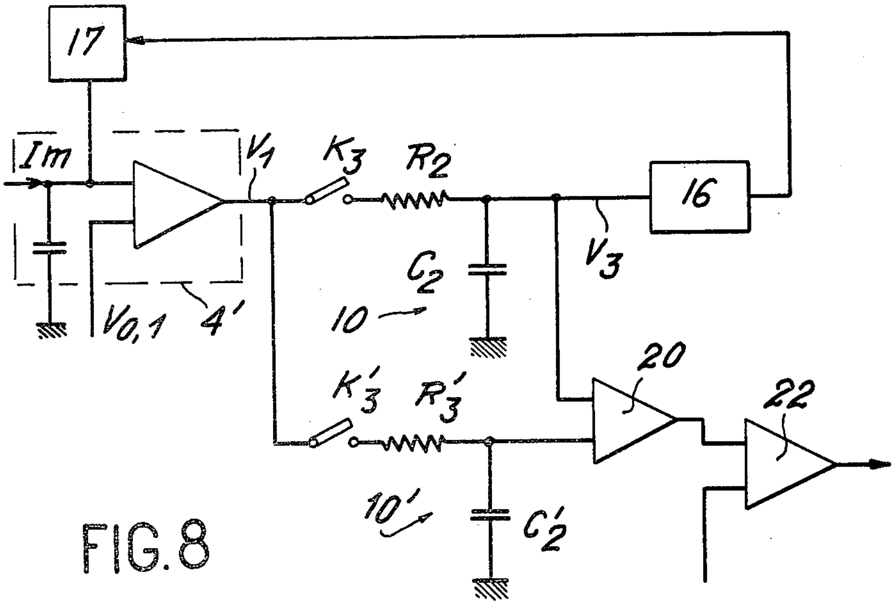

FIG. 4' is an alternative arrangement of the circuit shown in FIG. 4, in which the transducer delivers a voltage;

FIG. 5 is an alternative arrangement of the circuit shown in FIG. 4;

FIG. 5' is a time diagram illustrating the operation of the circuit of FIG. 5 with a high-frequency control;

FIG. 6 is a detailed example of construction of, the detector which again makes use of the alternative arrangement of FIG. 5;

FIG. 7 is a diagram illustrating the mode of operation of the circuit shown in FIG. 6;

FIG. 8 is an alternative form of construction of the detector which gives the relative variations of the signal delivered by the transducer;

FIG. 9 is a circuit for calibrating the current delivered by the transducer;

FIG. 10 shows one form of construction of a resistor having a high value of resistance for a delay circuit.

Figure 1:
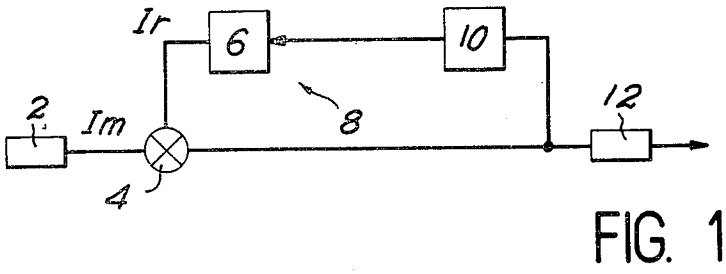
FIG. 1 is a diagram illustrating a simple form of construction of the detector.

In FIG. 1, there is shown a first simple form of construction of the detector.

This detector comprises a transducer 2 designed to convert to a current the physical quantity which is representative of the phenomenon. It is clearly possible to employ various types of transducers such as combustion-gas detectors of the ionization chamber type or temperature detectors constituted by a reverse-biased diode.

The current $I_m$ delivered by a transducer 2, which current is usually of very low value, is fed into the comparator 4. The comparator 4 also receives a so-called reference current $I_r$ which is delivered by the current generator 6. Since the currents vary with time, they may be written as mathematical functions $I_m(t)$ and $I_r(t)$, respectively.

The current generator 6 is controlled by the loop 8 which collects at each instant at the output of the comparator 4 the difference between the currents $I_m$ and $I_r$. This error signal controls the current generator 6 in such a manner that the current $I_r$ delivered by the latter is readjusted to the value of the current $I_m$.

The control loop comprises a delay circuit 10 having a time constant of sufficiently high value.

It is therefore apparent that the current $I_r$ is equal to the value which the current $I_m$ had possessed $\tau$ seconds before, where $\tau$ is equal to the time constant of the delay circuit 10.

It is therefore apparent that there is obtained at the output of the comparator 4 a voltage $V_{cf}$ which is representative of the variation $I_m - I_r$ of the current between the instants t and $(t+\tau)$ or, as a mathematical function $$V_{cf} = k\,[I_m(t) - I_r(t)] = k\,[I_m(t) - \frac{V_{cf}}{k}\,(t - \tau)]$$

This current variation which is therefore representative of the variation in the physical quantity which is characteristic of the phenomenon is introduced into a threshold circuit 12 which delivers a signal for triggering the alarm if the current variation between two separate instants of $\tau$ exceeds a given threshold value.

It is therefore apparent that this circuit does not work on the absolute values of the current delivered by the transducer but on the slope of variation of said current as a function of time.

Said detector can clearly have in addition an absolute threshold which triggers the alarm if the absolute value of the current $I_m$ exceeds a given threshold value above which there cannot be any uncertainty in regard to the abnormal character of the phenomenon.

Figure 2:
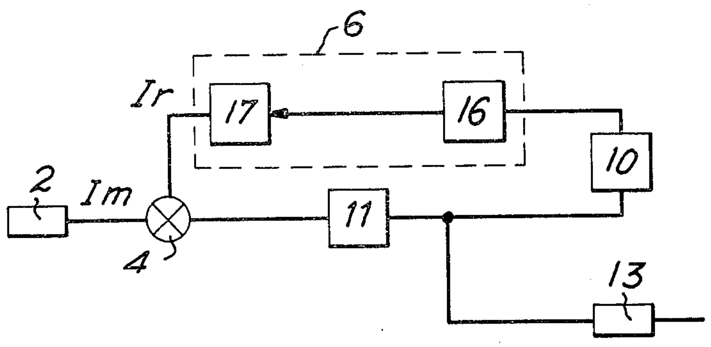
FIG. 2 illustrates a more elaborate form of construction of said detector.

In FIG. 2, there is shown a more elaborate form of construction of the detector. In this embodiment, there is again shown the transducer 2 which delivers the current $I_m$, said current being fed into the comparator 4. The current $I_r$ delivered by the current generator 6 is applied to the other input of the comparator 4.

The current generator 6 is a generator which operates on the principle of charge transfer and its operation will be explained in greater detail hereinafter.

At the output of the comparator 4, there is obtained a voltage $V_1$ which is fed into a matching circuit 11. This circuit amplifies the voltage V and, by virtue of its high input impedance, prevents the generation of a current which would be liable to affect the comparison of the two low-intensity currents $I_m$ and $I_r$.

The output of the matching circuit 11 also constitutes the output of the device which produces the processed signal. The output signal may if necessary be fed into the filter 13 in order to eliminate fluctuations which are too short. The output of the matching circuit 11 is also fed into the delay circuit 10 which has a certain time constant $\tau$. The signal delivered by the circuit 10 drives a voltage-frequency converter 16 and this latter delivers a signal having a frequency which is proportional to the voltage applied to its input. The frequency F delivered by the converter controls the charge generator 17. The assembly consisting of converter 16 and charge generator 17 constitutes the current generator 6.

Figure 3:
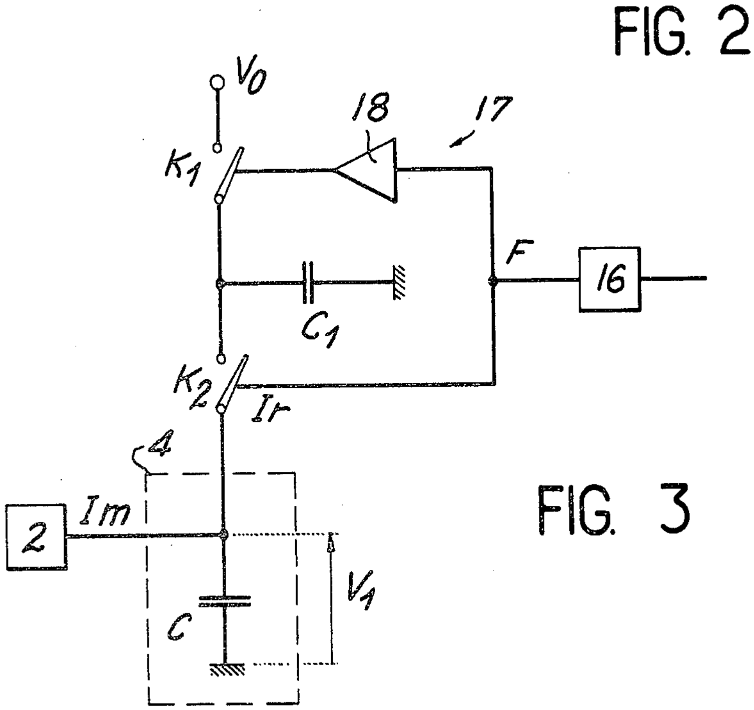
FIG. 3 is a general arrangement diagram of the reference current generator and of the comparator which are employed in the detector.

One form of construction of the charge generator 17 is shown diagrammatically in FIG. 3: this generator is essentially constituted by a capacitor $C_1$ which can be charged by the voltage source $V_0$ through the switch $K_1$.

The capacitor $C_1$ can be discharged to the comparator 4 through the switch $K_2$. Alternate opening and closing of the switches $K_1$ and $K_2$ are initiated by the signal having a frequency F. In order to obtain alternate opening and closing, the inverter 18 is interposed at the control input of the switch $K_1$.

It is therefore apparent that charging and discharging of the capacitor $C_1$ are carried out alternately by means of the inverter 18. The comparator 4 is constituted by a capacitor C having a high capacitance with respect to $C_1$ and having a very low leakage current with respect to the input current. It will be observed that the voltages of the two inputs and of the output of said comparator are equal to the value $V_1$. The current $I_r$ delivered by the generator is accordingly given by the formula $I_r = C_1F(V_0 - V_1)$.

In other words, this circuit is equivalent to a resistive circuit in which the mean resistance has the value: $R_e = 1/C_1F$ subjected to a voltage $V_0 - V_1$.

There is shown diagrammatically in FIG. 4 a first embodiment of the circuit illustrated in FIG. 2. In order to gain a clearer understanding of the figure, there are shown: the resistor $R_e$ which is equivalent to generator 17; the comparator 4' constituted by a differential amplifier having a gain G which receives at one input the voltage developed at the terminals of a capacitor C by the algebraic sum of the currents $I_m$ and $I_r$, which corresponds to the voltage $V_1$ of FIG. 3, and at its second input a reference voltage $V_{10}$; the delay circuit 10 constituted by the resistor $R_1$ and the capacitor $C_1$; and the voltage-frequency converter 16, the conversion coefficient of which is K.

At a slow regime (slow variations compared with the time constant of the loop $R_1C_1$) $V_1 = V_3$ and $R_e = 1/CKV_1$, whence the following relation is obtained:

$$V_1 = (V_0 + \frac{I_m}{CKV_1} - V_{10})\,G$$

if $V_1$ is replaced by $1/CKR_e$ there is obtained: $(V_0 - V_{10})R_e + I_mR_e^2 - 1/GCK = 0$ hence the solution:

$$R_e = \frac{V_{10} - V_0}{2\,I_m}\,(1 + \sqrt{\frac{4I_m}{GCK\,(V_0 - V_{10})}\,2) + 1}$$

which tends towards $(V_{10} - V_0/I_m)$ where GCK tends towards infinity and where $I_m$ is the mean current.

It is therefore apparent that, by making the product GK of substantial magnitude, the product $R_e$. $I_m$ is substantially constant. $R_e\,I_m$ represents the voltage at the input and it has just been demonstrated that this is a constant in an established regime; if the additional voltage produced by a rapid variation $\Delta I_m$ of $I_m$ is written, there is obtained:

$$\Delta V_1 = G(\Delta I_m R_e) = G\Delta I_m(V_{10} - V_0)/2I_m$$

which is in fact proportional to $\Delta I_m/I_m$. The output signal is then wholly representative of the rapid relative variations of the current $I_m$.

The square root can be made small compared to 1 by giving a high value to K.

There is shown in FIG. 5 a circuit for utilizing a higher time constant than in the case of an RC integrating circuit. The only difference lies in the presence of the switch $K_3$ which is associated with the integrating circuit. The switch $K_3$ is controlled by a clock (not shown) and makes it possible to open the negative feedback loop during a certain period of time.

The time constant thus introduced is equal to the time interval between two closures of the loop. The capacitor $C_2$ serves to store the voltage which is representative of the mean value of the measuring current during the, time of closure of the switch. This voltage is converted to frequency by the converter 16.

The time-delay thus introduced makes it possible to compare the mean current $I_m$ during two successive time intervals of closure of the switch and to trigger the alarm if the variation exceeds a predetermined threshold value.

Instead of initiating the opening and closing of the switch $K_3$ in such a manner as to have a substantial closure time (of the order of 10 seconds), it is possible to control the switch $K_3$ with a generator (not shown) for producing periodic signals, the period of which is of small value in comparison with the variations to be measured.

FIG. 5' illustrates the time diagram of the control of the switch $K_3$; said switch is closed during the time interval $t_1$ and open during the time interval $t_2$.

The time constant of the new circuit then has the value:

$$\tau' = R_2C_2 \cdot t_2/t_1$$

where $R_2C_2$ represent the time constant of the circuit if provision were not made for the switch.

This accordingly overcomes the disadvantage of the previous circuit in which it was not possible to perform measurements throughout the loop-circuit connection period.

There is shown in FIG. 6 a detailed form of construction of the detector in which a relative error signal is obtained.

The transducer 2, which delivers the current $I_m$, drives the comparator 4 as constituted by the capacitor C which is connected between the common point 100 and the ground lead. The point 100 is also connected to the current generator 17 constituted as already mentioned by the capacitor $C_1$ which is connected respectively to the reference potential $V_r$ through the MOS transistor 102 which performs the function of the switch $K_1$ and to the common point 100 through the MOS transistor 104 which performs the function of the switch $K_2$.

The output of the comparator 4 is connected to the input of the MOS transistor 106 which constitutes the matching stage 11 in conjunction with the MOS charge transistor 107. The output of the matching stage is connected on the one hand to the filter 13 and on the other hand to the delay circuit 10. The filter 13 is essentially constituted by the capacitor $C_3$ connected between ground and the MOS transistor 108 to which the output of the matching circuit is applied.

The other terminal of the transistor 108 drives the MOS transistor 110 which determines a threshold. There is obtained at the output 112 of said transistor 110 the logical signal having a level 1 or 0 which is capable of triggering the alarm according as the level of the signal is either higher or lower than the preset threshold, and it is shown that this signal is a function of the relative variations of $I_m$.

The matching circuit 11 is also connected to the delay circuit 10 which also performs the function of a storage device.

The delay circuit 10 is provided at its input with a MOS transistor 114 which performs the function of the switch $K_3$.

The output of the transistor 114 is connected to one of the plates of the capacitor $C_4$ which performs the function both of integrator and of memory or storage device.

The conduction of the transistor 114 is controlled by the signal H delivered by the clock 116 which is connected to its gate input. H represents a fraction of the period T of the clock signal. The complementary signal is designated as $\overline{H}$.

The output 118 of the delay circuit drives the input of the voltage-frequency converter 16. This converter has already been described in French patent Application No EN 74 00295 of Jan. 4th, 1974 (FIG. 2) but the diode detector for producing a current has been replaced by an MOS transistor which performs the voltage-current conversion; said converter essentially comprises a capacitor $C_5$ which makes it possible to adjust the conversion ratio between the voltage to be applied to its input and the frequency F of the signal which it delivers at its output.

In the particular case of FIG. 6, the converter further comprises a frequency shift capacitor $C_6$.

This capacitor can be connected in parallel with said capacitor $C_5$ (through the MOS transistor 120 which performs the function of a switch) and causes a reduction in the output frequency of the voltage-frequency converter having a constant input voltage.

Said MOS transistor is controlled through its gate input by the signal $\overline{H}$ delivered by the clock 116.

In other words, when the transistor 120 is in the cut-off state, the transistor 114 is in the conducting state and conversely.

At its output 122, the converter 16 delivers a signal F, the frequency of which is proportional to the voltage applied to its input and inversely proportional to the capacitance connected to the input ($C_5$ or $C_5+C_6$). The output 122 is connected on the one hand to the gate of the MOS transistor 102 of the generator 17 and on the other hand to the gate of the MOS transistor 124. The reverse output 126 of the voltage-frequency converter is connected on the one hand to the gate input of the MOS transistor 104 of the generator 17 and on the other hand to the gate input of the MOS transistor 128.

The circuit further comprises an absolute current threshold 130 as essentially constituted by the capacitor $C_7$ which is capable of discharging into the resistor R. Said resistor R is connected between the ground lead and the gate of the MOS transistor 132.

The capacitor $C_7$ is charged by the current delivered by the capacitor $C_8$ through the MOS transistor 128 which performs the function of a switch.

The capacitor $C_8$ is in turn charged by the high-voltage supply through the MOS transistor 124 which also performs the function of a switch.

If the frequency is very high, the capacitor $C_7$ does not have time to discharge into the resistor R, the MOS transistor 132 is therefore in the conducting state and an alarm signal appears at the output 134. On the contrary, if the frequency is of low value, the capacitor $C_7$ discharges into the resistor R and the transistor 132 is caused to cutoff.

FIG. 7 illustrates the operation of this embodiment in the case in which the abnormal phenomenon causes a decrease in current. The times have been plotted as abscissae and the current intensities as ordinates.

Curve I represents the fluctuations of the current $I_m$ and curve II represents the successive values of the current $I_r$ delivered by the generator 17.

If T designates the clock period 116, there takes place in the case of a period T a modification of the value of the current $I_r$ since the connection of the capacitor $C_6$ in parallel modifies the value of the conversion ratio K and therefore the value of the frequency F while the circuit is open (the voltage is stored at the terminals of the capacitor $C_4$).

During the loop-circuit connection (switch $K_3$ closed, and MOS transistor 114 in the conducting state for the clock signal H), the normal value of K is determined by $C_5$ and $C_6$, and the current generator delivers the current $I_r=I_m$.

The switch $K_3$ is then caused to open (clock signal $\overline{H}$) and the capacitor $C_4$ continues to store the voltage which is present therein.

At the same time, K is modified by the value ΔK by withdrawal from the capacitor $C_6$. The variation of K introduces a similar variation of $R_e$ which becomes:

$$R_e' = \frac{1}{C_1 (K - \Delta K) V_3}$$

A deviation is imposed a priori between the current $I_m$ and the current $I_r$. If the deviation is reduced to zero (point A), the alarm is triggered. The point B corresponding to the following reduction to zero can serve as a confirmation.

Since the alarm is triggered in respect of $V_1=V_3$, we have:

$$I_m' = \frac{V_1}{R_e'} = \frac{V_1 \times C_1}{C_1 (K - \Delta K) V_3}$$

$$I_m = \frac{V_1}{R_e} = \frac{V_1}{C_1 K \cdot V_3}$$

we then have:

$$I'_m/I_m = K - \Delta K/K$$

namely:

$$\Delta I_m/I_m = -\Delta K/K$$

In this embodiment, the foregoing results in triggering of the alarm from the relative decrease in the current $I_m$, this relative decrease being controlled by the user by adjusting the relative values of the capacitors $C_5$ and $C_6$.

The circuit (not shown) which makes it possible to trigger the alarm in respect of $V_1=V_3$ is, for example, a differential amplifier followed by a zero-crossing detector.

If it is desired to trigger the alarm in respect of a relative increase of the current $I_m$, especially in the event that the current delivered by the transducer increases with the amplitude of the phenomenon (which applies to the temperature transducer in the case of fires), it is necessary only to connect the gate of the MOS transistor 120 to the output H of the clock 116 (this connection being shown in chain-dotted lines) and to suppress the connection between the clock output $\overline{H}$ and said transistor.

In the embodiment which is illustrated in FIG. 6, the absolute current threshold for triggering an alarm is produced by the threshold voltage of the MOS transistor 132.

Should it be desired to have a more accurate threshold, said transistor can be replaced by a comparator which receives on the one hand the current delivered by the transistor 128 and on the other hand the reference current. The comparator can be constituted by a differential amplifier having a low offset voltage.

It has been seen that the circuit shown in FIG. 4 delivered a signal which was representative of the relative variation of the current delivered by the transducer only if the coefficient K of conversion of the voltage-frequency, converter was of a high order.

In practice, however, the coefficient is not very high. A first solution which makes it possible to have a representative signal for the relative variations without having a very high coefficient K has been described in connection with FIG. 6.

Another solution to this problem is illustrated in FIG. 8 which makes further use of FIG. 5 by adding to this latter the elements which are specific to this embodiment. This form of construction essentially consists in collecting the potential difference at the terminals of the delay circuit 14, that is, in collecting the potential difference $V_1-V_3$.

This arrangement is preferably combined with a filter for selecting the rates of variation which are of interest.

To this end, there is connected to the output of the comparator 4' a switch $K'_3$ which controls a delay circuit 10' constituted by the resistor $R'_3$ and the capacitor $C'_2$ and which performs the function of a filter. The output of said delay circuit 10' is connected to one of the inputs of the comparator 20, the other input of which is connected to the output of the delay circuit 10. The output of the comparator 20 is connected to the input of the threshold 22, the output of which triggers the alarm if the threshold level is attained. The switches $K_3$ and $K'_3$ are operated simultaneously; the time constant of the circuit $R'_3$, $C'_2$ clearly has a value which is substantially lower than that of the circuit $R_2$, $C_2$.

Moreover, by reason of the symmetry in the control circuit of the threshold 22, compensation is provided for the parasites introduced by the switches.

In an established regime, the voltages $V_1$ and $V_3$, are equal. Since the circuit 14 in any case allows the rapid variations of $I_m$ to pass, the difference $V_1-V_3$ in fact gives the variations of $V_1$ which are of interest.

In FIG. 9, there is shown a circuit for calibrating the normal current $I_{m0}$ delivered by the transducer 2.

In fact, the different transducers which can be employed deliver a current $I_m$ which is highly variable according to the type of transducer when no abnormal signals are present and, in spite of these variations, it is desirable to have the possibility of employing the same relative and absolute alarm threshold levels.

Depending on the type of transducer employed, it would therefore be necessary to modify and to adjust the threshold level of detection of the relative value of the current $I_m$ delivered by the transducer.

The circuit shown in the figure makes it possible to obtain at its output a "normed" current $I_{mB,0}$ irrespective of the value of the normal current $I_{mA,0}$ delivered by the transducer.

The circuit comprises a comparator $4_A$, there being applied to said comparator on the one hand a voltage which is proportional to the sum of currents $I_{mA}$ delivered by the transducer and $I_{rA}$ delivered by the current generator $17_A$ (which is identical with the generator 17) and on the other hand the reference voltage $V_{1,0}$. The circuit also comprises an integrating circuit $R_A$, $C_A$ and a voltage-frequency converter $16_A$. The output of the converter $16_A$ drives on the one hand the control input of the current generator $17_A$ and on the other hand another current generator $17_B$ which delivers the current $I_{mB}$.

The time constant $R_AC_A$ of said integrating circuit is clearly of very considerably lower value than that of the measuring circuit as was the case with the circuit 10' of FIG. 8. The variations of $I_{mB}$ are therefore the useful variations of $I_{mA}$; only the intensity of $I_{mB}$ is modified with respect to that of $I_{mA}$.

By adjusting the value of the voltage $V_0$ of the current generator $17_A$, the normal value $I_{mB,0}$ of the current $I_{mB}$ can be maintained constant irrespective of the normal value $I_{mlA0}$ of the current $I_{mA}$. In addition, the following proportionality is satisfied:

$$\Delta I_{mA}/I_{mA}=\Delta I_{mB}/I_{mB}$$

The current $I_{mB}$ is measured by means of any one of the measuring circuits described earlier.

The foregoing description has been given in the case in which the transducer delivers the useful signal in the form of a current, which is the most frequent case. However, the invention is extended to include arrangements in which said signal is a voltage derived from a thermocouple, for example.

The diagram of FIG. 4 can be modified, for example by introducing in this latter the modifications which are illustrated in FIG. 4': in this case the transducer 2 delivers a voltage $V_m$ applied to the end of a resistor $R_m$, the other end of which is connected to the comparator 4'. The value adopted will accordingly be $V_{10}=0$.

It is also possible to carry out a voltage-current conversion by means of an MOS transistor, the voltage $V_m$ being applied to the gate of said MOS transistor which delivers a current $I_m=K(V_m-V_s)$ in which $V_s$ in the MOST threshold voltage and $\Delta I_m=K\Delta V_m$.

Instead of a reference current $I_r$, it is also possible to employ a reference voltage $V_r$ which is compared directly with the voltage $V_m$ within a voltage comparator, the reference voltage generator being controlled by the signal derived from the comparator. Since reference voltage generator can also be constituted by a voltage-frequency converter followed by a frequency-voltage converter which delivers the voltage $V_r$.

In accordance with another alternative form of construction, a stage having an exponential response (current as a function of voltage) can be introduced between the delay circuit 10 and the input of the voltage-frequency converter 16.

In this form of construction, the operation is as follows. Referring to FIG. 4 (in which the exponential function stage has been added), it is apparent that at the output the frequency F is an exponential function of the voltage $V_3$. In consequence, $V_3$ is the image of the Napierian logarithm of F. The voltage $V_1$ therefore represents the logarithmic derivative of the frequency. At equilibrium, $I_m=I_r$. Hence the value of $V_1$ at equilibrium is $\Delta I_m/I_m$ irrespective of the value of $I_m$. The introduction of the exponential function therefore makes it possible to dispense with the calibrating circuit shown in FIG. 9.

FIG. 10 shows a form of construction of high-value resistors which serve to form delay circuits which have a very long time constant. For example, they can replace the resistors $K_3$, $R_2$ and $K'_3$, $R'_3$ of FIG. 8. As shown in the figure, a resistor is constituted by the capacitor C' and the switches k1 and k2 which are controlled in alternate sequence by the clock H, the frequency of which is equal to f. The value of the resistor is equivalent to 1/C'f.

What we claim is:

1. A detector for abnormal phenomena, and comprising:

a transducer for converting to an electrical signal a physical quantity which is representative of an abnormal phenomenon;

a comparator having two inputs and an output;

a delay circuit having an input and an output;

means connecting the output of said transducer to one of the inputs of said comparator;

means connecting the output of said comparator to the input of said delay circuit;

an electrical signal generator having an output and a control input;

means connecting the output of said delay circuit to the control input of said generator for causing said output of said generator to deliver a signal which is representative of said electrical signal corresponding to said physical quantity, but provided with a delay introduced by said delay circuit;

means connecting the output of said generator to the other input of said comparator, whereby the electrical signal at the output of said comparator is representative of the time-dependent variations of the electrical signal from said transducer.

2. A detector according to claim 1, wherein the signal delivered by said transducer is a current.

3. A detector according to claim 1, wherein said detector comprises a circuit for comparing the signal delivered by said comparator with a preset level.

4. A detector according to claim 2, wherein said delay circuit comprises a resistance-capacitance assembly.

5. A detector according to claim 2, wherein said signal generator is a current generator of the charge-transfer type and wherein a voltage-frequency converter is interposed between said delay circuit and said generator.

6. A detector according to claim 2, wherein said comparator comprises a capacitor in which one of the plates is coupled to the two comparator inputs and receives the signal delivered by said transducer and the signal delivered by said generator, and in which the other plate is connected to ground.

7. A detector according to claim 5, wherein said delay circuit comprises a delay circuit switch controlled by a clock signal through a resistor and through a capacitor mounted between ground and the output of said resistor.

8. A detector according to claim 7, wherein said voltage-frequency converter comprises a first capacitor which is capable of establishing the voltage-frequency conversion ratio and a second capacitor mounted in parallel with the first capacitor through another switch controlled by a clock signal in such a manner that the opening of said another switch is synchronized with the opening of said delay-circuit switch.

9. A detector according to claim 8, wherein said detector comprises a differential amplifier having two inputs and an output, the two inputs of said amplifier being connected to the input and output, respectively, of the delay circuit, and a threshold device connected to the output of said differential amplifier.

10. A detector according to claim 7, wherein said detector comprises a device for generating a signal which is representative of the current delivered by said transducer, said device comprising a current generator for charging through a switch, controlled by the output of the converter, a capacitor which is mounted in parallel with a resistor.

11. A detector according to claim 1, wherein said detector comprises a second comparator having two inputs connected to the input and output, respectively, of the delay circuit.

12. A detector according to claim 11, wherein said detector comprises between the input terminal of said delay circuit and said second comparator, with a second delay circuit.

13. A detector according to claim 12, wherein said detector comprises a circuit for comparing the signal delivered by said second comparator with a preset threshold value.

14. A detector according to claim 2, wherein said detector comprises, between the output of the transducer and the comparator, a circuit for calibrating the current delivered by said transducer and having a delay circuit, the time-delay introduced by the delay circuit of said calibrating circuit being of low value with respect to the time-delay introduced by the delay circuit connected between the output of said comparator and the control input of said generator.

15. A detector according to claim 1, wherein said signal delivered by said transducer is a voltage and wherein said detector comprises a voltage-current converter.

16. A detector according to claim 5, wherein said detector comprises a stage, having an exponential response, between the voltage-frequency converter and the delay circuit.

17. A detector according to claim 8, wherein said detector comprises a device for generating a signal which is representative of the current delivered by said transducer, said device comprising a current generator for charging through a switch, controlled by the output of the converter, a capacitor which is mounted in parallel with a resistor.

* * * * *